US006891266B2

(12) United States Patent
Kinayman et al.

(10) Patent No.: US 6,891,266 B2
(45) Date of Patent: May 10, 2005

(54) RF TRANSITION FOR AN AREA ARRAY PACKAGE

(75) Inventors: Noyan Kinayman, Malden, MA (US); Bernard A. Ziegner, Tyngsborough, MA (US); Richard Anderson, N. Attleborough, MA (US); Jean-Pierre Lanteri, Waltham, MA (US); M. Tekamul Buber, Nashua, NH (US)

(73) Assignee: MIA-com, Lowell, MA (US)

( * ) Notice: Subject to any disclaimer, the term of this patent is extended or adjusted under 35 U.S.C. 154(b) by 0 days.

(21) Appl. No.: 10/075,406

(22) Filed: Feb. 14, 2002

(65) Prior Publication Data

US 2003/0151133 A1 Aug. 14, 2003

(51) Int. Cl.[7] .............................................. H01L 23/34
(52) U.S. Cl. ...................... 257/724; 257/713
(58) Field of Search ................................. 257/713, 738, 257/724

(56) References Cited

U.S. PATENT DOCUMENTS

| 5,424,693 | A | | 6/1995 | Lin ............................. 333/33 |
| 5,455,456 | A | * | 10/1995 | Newman ..................... 257/704 |
| 5,523,622 | A | | 6/1996 | Harada et al. ............... 257/734 |
| 5,608,263 | A | | 3/1997 | Drayton et al. ............. 257/728 |
| 5,635,301 | A | | 6/1997 | Kondo et al. ............... 428/426 |
| 5,640,048 | A | * | 6/1997 | Selna .......................... 257/738 |
| 5,753,376 | A | | 5/1998 | Ikuina et al. ............... 428/469 |
| 5,832,598 | A | | 11/1998 | Greenman et al. ............ 29/840 |
| 5,886,398 | A | | 3/1999 | Low et al. ................... 257/667 |
| 5,914,216 | A | | 6/1999 | Amou et al. .............. 430/280.1 |
| 5,939,778 | A | | 8/1999 | Boutin et al. ............... 257/678 |
| 5,952,709 | A | | 9/1999 | Kitazawa et al. ........... 257/664 |
| 6,034,427 | A | | 3/2000 | Lan et al. .................... 257/698 |
| 6,204,448 | B1 | | 3/2001 | Garland et al. ............ 174/52.3 |
| 6,215,377 | B1 | | 4/2001 | Douriet ....................... 333/247 |
| 6,228,468 | B1 | | 5/2001 | Vodrahalli ................... 428/210 |

FOREIGN PATENT DOCUMENTS

EP 0 725 441 A2 8/1996 ........... H01L/23/66

OTHER PUBLICATIONS

Patent Abstracts of Japan, Publication No. 2001177012, Publication Date, Jun. 29, 2001, Application Date Nov. 26, 2000, Application No. 11336815.
Patent Abstracts of Japan, Publication No. 2001298306, Publication Date, Oct. 26, 2001, Application Date Apr. 14, 2000, Application No. 2000113659.

* cited by examiner

Primary Examiner—Amir Zarabian
Assistant Examiner—Kiesha Rose

(57) ABSTRACT

A laminate multilayer ball-grid-array package is suitable for millimeter-wave circuits. The frequency bandwidth of the package is DC to 40 GHz. The package is made using laminate circuit board materials to match the temperature expansion coefficients of the package to the host PCB. Electrical connection between the package and the host PCB on which the package is mounted is achieved using ball-grid-array technology. The package can be sealed, covered, or encapsulated, and is suitable for high-volume production.

23 Claims, 13 Drawing Sheets

200

RF TRANSITION FOR AN AREA ARRAY PACKAGE

FIELD OF THE INVENTION

The present invention relates to semiconductor device packages generally, more specifically to area array packages, and more particularly to ball-grid-array (BGA) type packages that are used for RF and millimeter-wave integrated circuit (IC) packaging.

BACKGROUND OF THE INVENTION

Ball-grid-array (BGA) packages are commonly used in electronics to minimize circuit board area for a given circuit functionality. This is achieved by using the entire area under the package to create an array of I/O connections using pre-attached solder balls. BGA packages are also very suitable for high-volume production because automated pick-and-place machines can handle them and they are attached to the next higher level of assembly printed circuit board using solder re-flow methods.

Ceramics are the materials most often used to build high-frequency BGA packages. Alumina, high-temperature co-fired (HTCC) ceramics, and low-temperature co-fired (LTCC) ceramics are examples of different ceramic materials that can be used in designing such packages. The main problem with ceramic materials is that the coefficient of thermal expansion (CTE) of most of the ceramic materials is significantly different from the CTE of nearly all polymer and polymer-composite laminate printed circuit boards to which the package would be attached in a subsequent higher level assembly. This poses a difficulty in mounting large ceramic BGA packages on host Printed Circuit Boards (PCBs) constructed using laminate materials, because standard size ball contacts nearly always develop cracks after thermal cycling unless additional precautions such as underfill are used. These cracks eventually result in open-circuit failure by disconnection of the signal lines. In addition, the most commonly used LTCC ceramic materials employ thick film processes that limit the minimum line width and gaps that can be manufactured. Finally, it is not easy to combine different ceramic materials having different dielectric constants into a functioning multilayer substrate, as would be desirable in the design of an RF or millimeter-wave package. BGA packages are extensively addressed in the literature.

U.S. Pat. No. 6,034,427 to James J. D. Lan, et al., describes a typical BGA package suitable for integrated circuit (IC) packaging. In Lan et al., the BGA balls are placed on micro filled via holes to optimize the BGA area. The IC can be placed in a cavity up or cavity down position and it is encapsulated using a glob-top approach. The connections between the IC and the BGA connections are achieved using wire-bonds. However, Lan et al.'s technology is not suitable for packaging millimeter-wave circuits because using glob-top to cover the IC can deteriorate electrical performance due to the relatively high dielectric loss tangent of the glob-top materials. In addition, the difference between the dielectric constants of the glob-top material and the substrate material that carries the transmission lines causes the isolation between the transmission lines to deteriorate. Lan, et al., also describes placing the BGA balls directly on top of the via holes.

U.S. Pat. No. 5,939,778 to Lynda Boutin et al. describes an integrated circuit chip package. However, Boutin et al., like Lan et al., only address the issue of encapsulating integrated circuits using transfer molding to prevent damage. The difficulties of using plastic materials to encapsulate millimeter-wave circuitry are described above.

U.S. Pat. No. 6,228,468 to Nagesh K. Vodrahalli describes a highdensity ceramic BGA package. This patent purportedly addresses the thermal expansion mismatch problem between the BGA package and the host PCB by using specially composed ceramic materials. The CTE of typical PCB materials is between 13 ppm/C° and 20 ppm/C°. However, commonly used aluminum oxide ceramics have a CTE around 7 ppm/C°. Vodrahalli presents a multilayer ceramic BGA package which has a CTE between 10–15 ppm/C°, which is close to the CTE of host PCBs. The process steps for that method start with formation of the green tape with raw material powder. After forming the green tape, the circuit lines and via holes are printed using a thick film process. Then, the whole circuitry is sintered (or fired) to make it rigid. Finally, surfaces are smoothed and metal traces are plated. Sintering can be done at high or low temperatures depending on the types of ceramic materials used. However, one of the disadvantages of this method is that it uses a thick film method to form the metal traces on the circuit, which has relatively low resolution compared to thin film and photolithographic techniques. Another disadvantage is that during sintering, the circuitry shrinks. Although the percentage of this shrinkage can be controlled precisely, the amount of shrinkage across the circuitry may not be constant if some parts of the circuitry contain more metals than other parts. In other words, the circuit may distort after the sintering process.

U.S. Pat. No. 5,832,598 to Norman L. Greenman et al. describes a method of making a microwave circuit package. This patent addresses the difficulty in the sintering process of ceramics resulting from non-uniform shrinkage across the circuit as described above, and tries to solve it by using a single layer pre-sintered ceramic substrate and employing thin-film techniques. It also demonstrates an encapsulation technique suitable for millimeter-wave circuits using an appropriate lid structure without using any kind of plastic molding for encapsulation. The disadvantage of Greenman's method is, as the package size becomes larger, the thermal expansion mismatch starts to be an issue. Although presintered ceramic materials provide a good solution from an electrical performance point of view for small packages at millimeter-wave frequencies, the thermal expansion mismatch problem makes them very difficult to use for larger package sizes.

Greenman et al. also describes a method to compensate the RF signal transitions for optimum electrical performance. It is known that the BGA transitions result in significant series inductance that deteriorates the reflection loss of the circuit at high frequencies. The series inductance of BGA transitions is usually compensated by placing ground vias around the signal via hole to increase the shunt capacitance to ground. This structure can be viewed as a quasi-coaxial structure along the BGA transition. Since the characteristic impedance of a loss-free TEM transmission line is given by the equation $Z_0=\sqrt{L/C}$, increased series inductance can be compensated by increasing the shunt capacitance to keep the $Z_0$ same (to some extent). Then, by adjusting the spacing between the center via and the ground vias as well as the via diameters (changing the shunt capacitance), the impedance of the transition is brought closer to 50 Ohms in order to match it to the rest of the circuitry. Note that the permittivity of the substrate materials also affects this impedance but this value is usually fixed beforehand.

U.S. Pat. No. 6,215,377 to Daniel F. Douriet describes a low-cost wideband RF port structure for a microwave circuit. This patent describes how to design broadband RF transitions for millimeter-wave IC packages though it does not address the actual packaging problems in detail. Douriet uses coplanar waveguides for his RF BGA transition. Although for small numbers of transitions the coplanar waveguides can be used, for high density RF connections using coplanar waveguides is not preferred because it requires additional ground traces along the signal conductor, using up more substrate area. Besides, coplanar waveguides are prone to excitation of higher order modes which can be an issue for electrically long transmission lines. Another difficulty related to use of coplanar waveguides is that for the same impedance values and substrate heights, the width of the center conductor of the coplanar waveguides is narrow. This increases the metallization losses and makes manufacturing more difficult.

U.S. Pat. No. 5,424,693 to Chao-Hui Lin describes a surface mountable microwave IC package suitable for high frequency operation. However, in this patent, a thick-film technique is employed and due to the aforementioned difficulties, it is not suitable for large, high-density BGA millimeter-wave packages.

An improved BGA package is desired.

SUMMARY OF THE INVENTION

One aspect of the present invention is a substrate for an area array package having a plurality of signal wirings. Each wiring has a first contact adapted to be connected to a respective terminal of an integrated circuit, and a second contact on a periphery of the substrate. The substrate has a ground structure including, for each signal wiring, a pair of rectangular ground plane portions located on opposite sides of the second contact of that signal wiring. The substrate has a plurality of ground via holes through the substrate, including at least one respective ground via hole through each rectangular ground plane portion.

Another aspect of the invention is an area array package comprising a substrate, a cover, and a bottom layer. The substrate has a plurality of signal wirings, each having a first contact adapted to be connected to a respective terminal of an integrated circuit, and a second contact on a periphery of the substrate. The substrate has a ground structure including, for each signal wiring, a pair of rectangular ground plane portions located on opposite sides of the second contact of that signal wiring. The substrate has a plurality of ground vias therethrough, including at least one respective ground via hole through each rectangular ground plane portion. The cover is above the substrate. The bottom layer of the package is formed of a dielectric material.

Another aspect of the invention is a printed circuit board assembly comprising a printed circuit board, a package substrate, a cover and a bottom layer. The printed circuit board has a circuit board substrate with circuit traces and a plurality of devices thereon. The plurality of devices include at least one integrated circuit package assembly that includes a package substrate having a plurality of signal wirings, each having a first contact adapted to be connected to a respective terminal of an integrated circuit and a second contact on a periphery of the package substrate, a ground structure including, for each signal wiring, a pair of rectangular ground plane portions located on opposite sides of the second contact of that signal wiring, and a plurality of ground vias through the package substrate, including at least one respective ground via hole through each rectangular ground plane portion. The cover is above the package substrate. The bottom layer of the package is formed of a dielectric material. The bottom layer has a plurality of solder attach pads, electrically connected to contacts of the circuit board substrate.

Still another aspect of the invention is an area array package comprising a substrate, a superstrate, a cover and a bottom layer. The substrate has a plurality of signal wirings, each having a first contact adapted to be connected to a respective terminal of an integrated circuit, and a second contact on a periphery of the substrate. The substrate has a signal via penetrating each second contact. The superstrate is formed of a dielectric material above the substrate. The superstrate has a respective opening therethrough above each second contact. The cover is above the superstrate. The bottom layer of the package is formed of a dielectric material.

An additional aspect of the invention is a method for forming an area array package comprising the steps of forming a plurality of signal wirings on a substrate, each signal wiring having a first contact adapted to be connected to a respective terminal of an integrated circuit, and a second contact on a periphery of the substrate, the substrate being formed of a type of material suitable for use in a printed circuit board; forming on a bottom layer of the area array package a plurality of solder attach pads aligned with the plurality of second contacts; forming a plurality of signal via holes penetrating the second contacts and solder attach pads and penetrating through the substrate and the bottom layer; filling the signal via holes with a conductive material capable of solidifying; and solidifying the conductive material to form conductive signal vias.

BRIEF DESCRIPTION OF THE DRAWINGS

Reference is made to the following figures in which like reference numerals represent the same items, and which figures are not drawn to scale.

OVERVIEW

Figure 1:
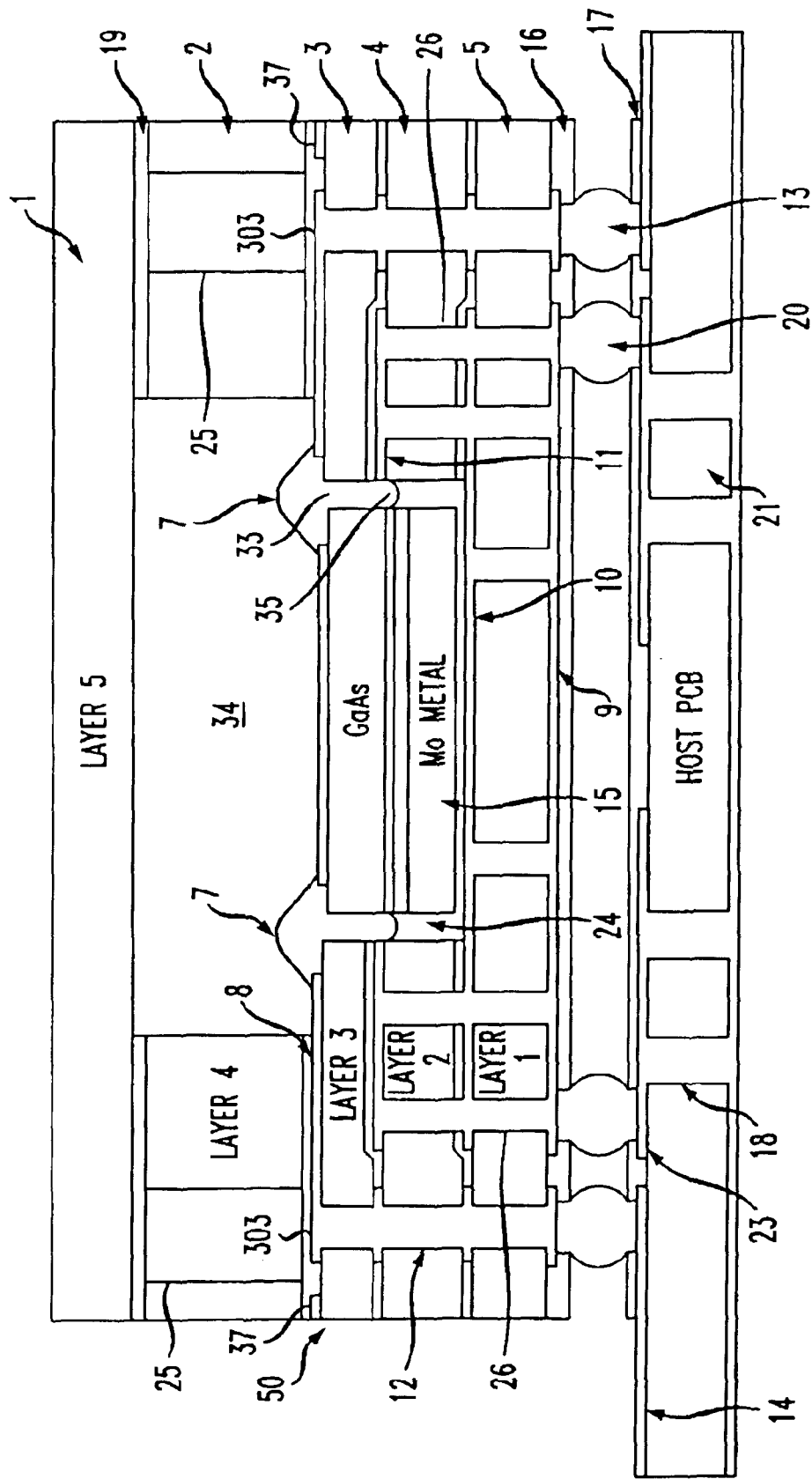
FIG. 1 is a side cross sectional view of an exemplary printed circuit board assembly including a BGA package according to the present invention

This description of the preferred embodiments is intended to be read in connection with the accompanying drawings, which are to be considered part of the entire written description of this invention. In the description, relative terms such as "lower," "upper," "horizontal," "vertical,", "up," "down," "top" and "bottom" as well as derivative thereof (e.g., "horizontally," "downwardly," "upwardly," etc.) should be construed to refer to the orientation as then described or as shown in the drawing figure under discussion. These relative terms are for convenience of description and normally are not intended to require a particular orientation.

The exemplary area array device is a BGA package 50 that solves the coefficient of thermal expansion (CTE) problem by providing a package using copper metallized laminate printed circuit board materials in a multilayer fashion. Usage of the laminate materials ensures that the temperature expansion of the package 50 is closely matched with the temperature expansion of the host PCB 21. In addition, the minimum line width and gap capabilities of the laminate board technology are now capable of creating circuit traces with dimensions suitable for most high frequency applications. Further, there is a very wide range of laminate board materials in terms of thickness, dielectric constant, dielectric loss, and mechanical properties, thus allowing the designer flexibility in developing a very functional package. These laminate materials are often called "soft-board", RF, microwave and millimeter wave laminate materials. The physical properties of the laminate board materials are chosen to optimize planarity and rigidity of the package. Dielectric properties are selected suitable for fine-line geometries, low-loss transmission lines, and minimum crosstalk.

For instance, in order to create an advanced, effective, high-density millimeter-wave circuit, one can use a high-dielectric constant material as a microstrip dielectric to have sufficiently narrow width of the transmission lines. Simultaneously, one has the opportunity of employing higher-loss dielectric materials such as those containing woven glass fibers in one or more other layers to increase the mechanical strength of the whole package 50 while concurrently lowering cost, without sacrificing the electrical performance. A robust mechanical strength in at least one layer (e.g., layer 1) of the package 50 is important because in order to achieve a good BGA contact, one must satisfy and maintain a minimum planarity requirement for the package during assembly.

Encapsulation suitable for millimeter-wave frequencies is another aspect of the exemplary embodiments. A superstrate material layer 2 is used on top of the substrate material layer 3 on which the signal traces are printed. The IC 6 is placed into a pocket 33 opened in the substrate material 2. Usage of a superstrate 2 provides enough clearance for the wire-bonds 7. It also improves the isolation between the signal traces 8 (shown in FIG. 2a). The isolation between coupled regular microstrip lines 8 is relatively low due to non-equal even- and odd-mode phase velocities. Addition of the superstrate 2 brings the even-mode and odd-mode phase velocities closer to each other hence increasing the isolation. The superstrate 2 does not improve the coupling between the microstrip lines 8; it only improves the isolation (the definitions of isolation and coupling for coupled microstrip lines are known to a person in the art). However, for some applications, like millimeter-wave cross-point switches, isolation is the important parameter because isolation directly affects crosstalk between adjacent channels. For this reason, usage of the superstrate 2 is advantageous.

Above the superstrate 2, the whole package 50 is covered with another flat but relatively strong dielectric layer 1 to finalize the packaging. The superstrate 2 allows the designer to improve the dielectric environment around the microstrip circuit traces 8, and to allow the use of a low-cost, relatively high-loss, mechanically robust lid or cover 1 to help maintain flatness. In some embodiments, this lid 1 may be the only member responsible for providing stiffness and planarity to the package. Also using multilayer laminate technology with the wide selection of dielectric values and thicknesses available enables transitions to the host PCB 21 using zero-height interconnects (commonly called land grid array or LGA packages).

Design of the BGA and inter-layer transitions 310 is another aspect of the exemplary package 50. Due to the very-wide bandwidth, low reflection, and insertion loss requirements, full-wave electromagnetic simulators are used to increase the accuracy of the design of the BGA transitions 310. There are different approaches in the literature to design such transitions. The basic technique is to provide ground vias 26 around the center signal via 12 to control the capacitance of the transition 310. By adjusting the distance between the ground vias 26 and the signal via 12, the shunt ground capacitance of the transition 310 is controlled. In this manner, it is possible to match the transitions 310 to the rest of the circuit thereby having relatively low reflection loss.

However, this approach is not enough when the thickness of the package 50 is relatively large. Therefore, in the exemplary embodiments, the capacitive loading of the center conductor 12 is controlled at each dielectric level. In the exemplary embodiments, the location of the ground openings 9a–11a (shown in FIG. 9) around the center signal conductor 12 are optimized for better electrical performance.

Figure 9:
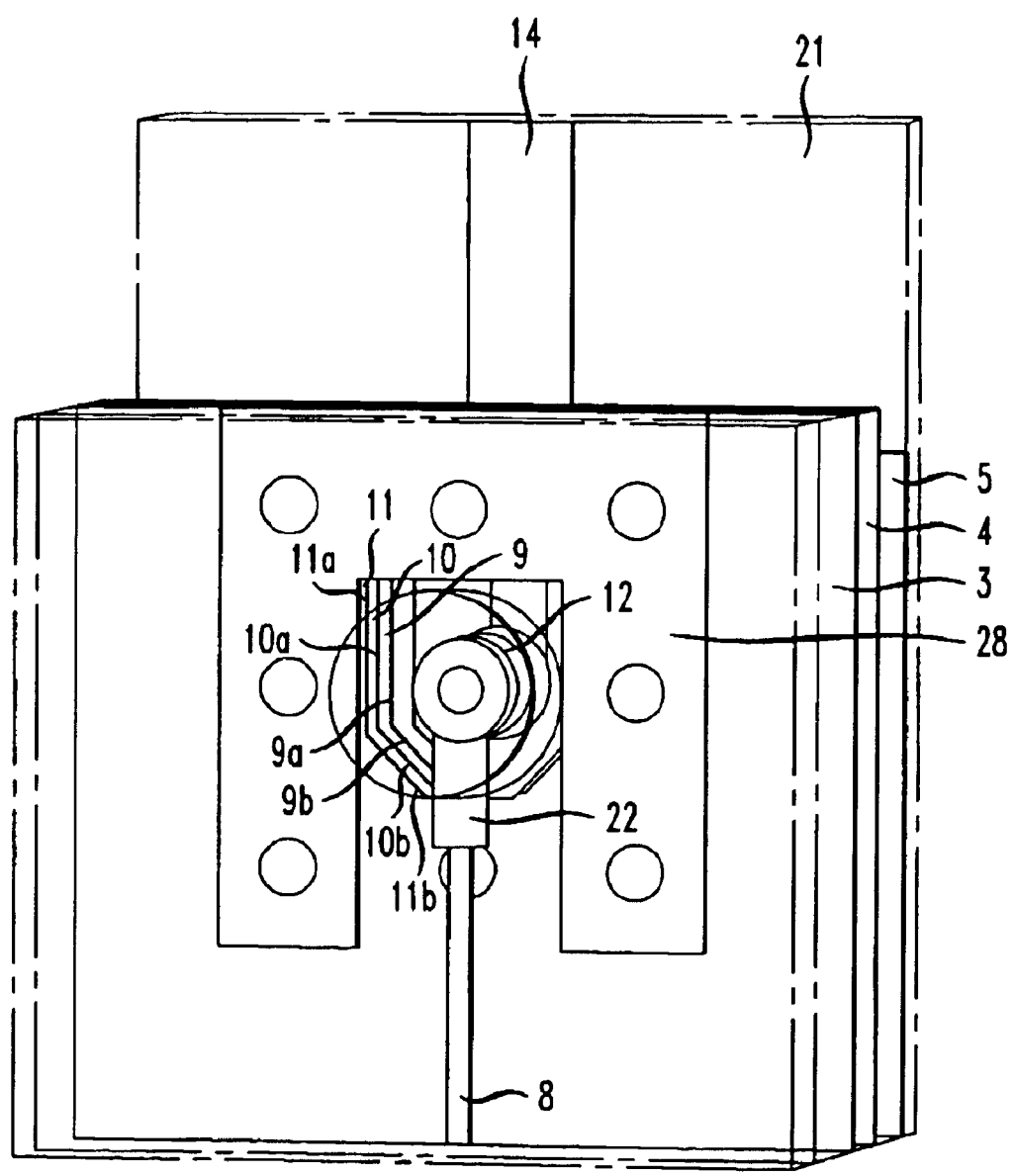
FIG. 9 is a top perspective view of the BGA transition, showing the openings in the various ground planes.

FIG. 9 is a perspective view looking down on the substrate 3 of the package, and the layers 4 and 5 below the substrate. As best seen in FIG. 9, each of the ground planes 9, 10, 11 has a respective ground plane opening 9a, 10a, 11a around each signal via 12. The ground plane openings 9a–11a are generally shaped like rectangles with two mitered corners 9b–11b on the side of the rectangle closest to the center of the package. The miters 9b–11b on each layer are used to adjust and optimize the insertion and reflection loss of the BGA transition. Note that this method provides more flexibility because the distance between via holes 26, via diameters and ball diameter are usually restricted by manufacturing limitations. One cannot change these parameters to match the transition 310 without any restriction. Therefore, changing the ground plane openings 9a–11a around the signal via 12 adds an additional parameter that can be varied to match the transition 310.

Another aspect of the exemplary embodiments is the opening of a hole 25 (which may be a circular hole) in the superstrate 2 directly on top of the buried BGA signal via holes 12. The inventors found that opening this hole 25 reduces the radiation from the BGA transition 310 significantly by reducing the permittivity of the medium on top of the signal via holes 12 to its lowest practical value. This enables directing the signal energy efficiently through the transitions 310. Optionally, the hole 25 may be filled with a material having a low dielectric constant, to reduce radiation from the BGA transition. Although a circular opening is shown in the exemplary embodiments, alternative shapes, such as rectangular shaped openings, may be used.

For maximum isolation, the dielectric constant of the encapsulation (superstrate 2) should be equal to the dielectric constant of the substrate 3, so that the microstrip lines 8 are embedded in a homogenous medium. In the exemplary embodiments, this problem is addressed by selecting the materials for the substrate 3 and the encapsulation 2 to be the same. In addition, there should preferably be an air cavity 34 at the vicinity of the millimeter-wave circuit 6 to minimize dielectric losses. This is also achieved in the exemplary embodiments.

In the exemplary embodiments, the BGA balls 13 and 20 are directly beneath the via holes 12 and 26, respectively. This approach improves the RF performance at high frequencies by reducing the total series inductance. This structure has not previously been used in laminate materials, possibly because of difficulty of filling the holes. The exemplary embodiments achieve this by first filling the vias 12, 26 with an appropriate conductive liquid, than drying (or curing) it, and than plating the surface.

In the exemplary PCB assembly 100, the thermal mismatch problem between the package 50 and the host PCB 21 is addressed by using one or more materials similar to that used for the host PCB, to make the package. Hence, the thermal mismatch problem is automatically addressed. The exemplary package 50 is encapsulated in a manner suitable for millimeter-wave frequencies.

In the exemplary embodiments, the ground planes around the signal via hole as well as the grounding vias, are used to control the impedance of the transition 310. The exemplary BGA package 50 includes multilayer laminate boards 1–5, so access is provided to inner ground layers to change the shunt capacitance.

These and other aspects of the exemplary embodiments are described in greater detail below.

DETAILED DESCRIPTION

FIG. 1 shows the simplified cross-section of a PCB assembly 100, including a host PCB 21 and an exemplary multilayer package 50. In FIG. 1, horizontal distances are compressed and vertical distances are expanded for ease of understanding. The electrical connection between the package 50 and the host PCB 21 is achieved by using area array technology.

The monolithic microwave integrated circuit (MMIC) 6 is placed into the pockets 33 opened in the dielectric laminates 3 and 4. The exemplary package has five different construction layers 1–5. Top layer 1 may be made of an epoxy glass laminate, such as FR4 or similar material, or a stiff plastic, and is used to provide stiffness to the package, as well as to cover the internal IC assembly. This is important because top layer 1 reinforces the package planarity, which is required for a BGA type package 50.

Next, layer 2 is the superstrate layer. It has a rectangular opening 34 at the location where the MMIC 6 is going to be placed. Superstrate layer 2 is used to improve electrical isolation by acting as a superstrate to the microstrip lines 8 and to provide a clearance between the top layer 1 and the MMIC 6 placed into the pockets 33. This permits cover attachment or other forms of die and lead protection such as encapsulation. The thickness of the superstrate layer 2 is determined by considering the amount of required electrical isolation and the minimum required clearance between the top cover 1 and the top of the MMIC 6 and the wire-bonds 7. Superstrate layer 2 also contains holes 25 on the top of the vertical signal transition 310 via holes to reduce radiation from the transitions. Although the exemplary holes 25 are circular in cross section, these openings may be formed using other shapes without affecting performance.

The next layer is substrate layer 3. Substrate 3 is shown in plan view in FIG. 2a. Substrate 3 is the layer on which microstrip transmission lines 8 are printed. A thin material having a relatively high dielectric constant is selected for layer 3, to achieve high-density, narrow transmission lines. There is a rectangular opening 33 in the substrate layer 3 to accept the MMIC 6. In the exemplary embodiment, both the substrate 3 and superstrate 2 are formed of material comprising PTFE with a ceramic filler, such as "RO3006®" material, sold by the Rogers Corporation of Chandler, Ariz. An alternative material may be an "RT/Duroid®" material, also sold by Rogers Corp. Many other commercially available dielectric materials may be used, and one of ordinary skill can readily select an appropriate material for a particular application. Although a variety of dielectric materials may be selected for the substrate and superstrate, it is preferred that the same material be used for both. Because the lid (top layer) 1 provides sufficient rigidity and planarity, the material for substrate 3 and superstrate 2 may be selected to optimize the electrical characteristics of the package (e.g., isolation between lines 8).

After the substrate layer 3, two more layers 4, 5 are used to provide additional ruggedness. Note that the intermedial layer 4 beneath the substrate 3 also has a rectangular opening 35 to accept the MMIC 6. An exemplary material suitable for intermediate and bottom layers 4 and 5 is a glass reinforced hydrocarbon/ceramic laminate, such as "RO4003®" sold by the Rogers Corp. In the exemplary embodiment, this is the same material that is used to form the host PCB 21. One of ordinary skill can readily select an appropriate material for a particular application.

In the exemplary embodiment, the opening 35 extends through layer 4. In alternative embodiments, it may be possible for layers 4 and 5 to be formed as a single layer having a pocket 35 that does not extend all the way through the layer.

Appropriate bonding films 19 are used to bond the dielectric layers 1–5 together. The critical layers are laminated together using a bonding film such as Flourinated Ethylene Propylene (FEP) with a very low dielectric loss at millimeter-wave frequencies. The bonding films 19 should have a dielectric constant and loss comparable to the adjacent substrate materials being used, and a very small thickness after bonding. These properties make FEP and similar materials ideal bonding films or adhesives to laminate the multi-layer package 50. The connection between the MMIC 6 and the microstrip transmission lines 8 can be achieved using wire-bonds 7 beam-leads (not shown), or flip-chip technology (described below with reference to FIG. 10). Note that the MMIC 6 is first mounted on a Mo carrier 15 prior to placement into the package 50. This ensures that the MMIC 6 stays flat, and is not damaged during placement and wire bonding. Appropriate conductive epoxy 24 may be used to mount the Mo carrier 15 into the package.

As best seen in FIG. 1, there are ground planes between the dielectric layers. Ground plane 9 is at the bottom of the package. Ground plane 10 is between layers 4 and 5. Ground plane 11 is between layers 3 and 4. The ground plane 28 on top of substrate 3 is described in detail below.

The package 50 is mounted onto the host PCB 21 using solder balls 20, 13. The electrical signals are carried by transmission lines 14 on the host PCB 21 and transferred through the BGA ball 13 and the via hole 12 to the transmission lines 8 printed on the substrate 3. The BGA ball 13 placed directly beneath the via hole 12 is the signal ball 13. Each signal ball 13 is surrounded on three sides by seven grounding balls 20 for matching and isolation purposes. This scheme is repeated for every RF BGA transition 310 in the package 50. The host PCB 21 has a ground plane 23 placed directly beneath the package 50, and via holes 18 to provide the shortest possible return path for the ground currents. This reduces the total inductance of the BGA transition 310. The ground via holes 18 are placed as close as possible to the BGA transition 310. The incoming signal trace 14 on PCB 21 is made narrower as it approaches to the signal ball 13 for matching purposes. Both the bottom of the BGA package 50 and the top of the host PCB 21 are covered with solder masks 16 and 17, respectively, to register the BGA balls 13 and 20. This also helps to confine the solder material in the BGA solder balls 13 and 20 during re-flow process by restricting the flow of the solder.

Figure 2A:
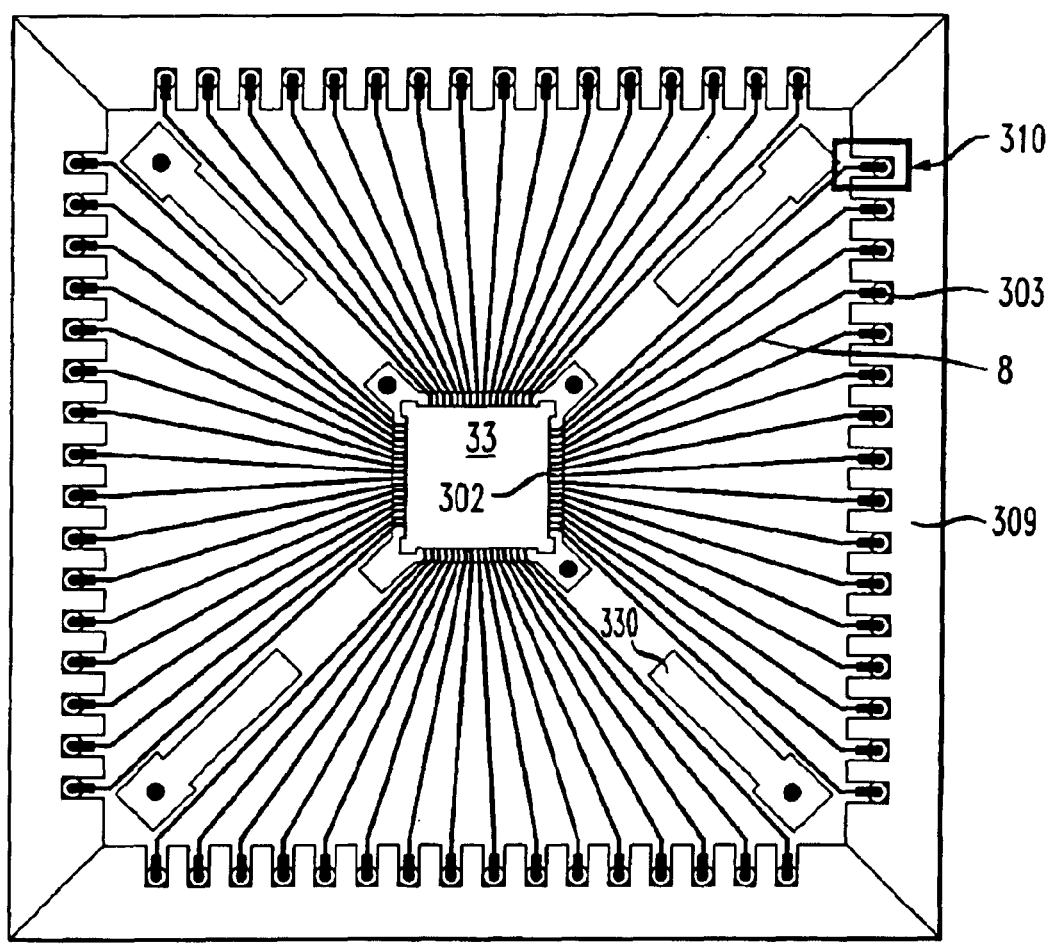
FIG. 2a is a plan view of the substrate shown in FIG. 1.
Figure 2B:
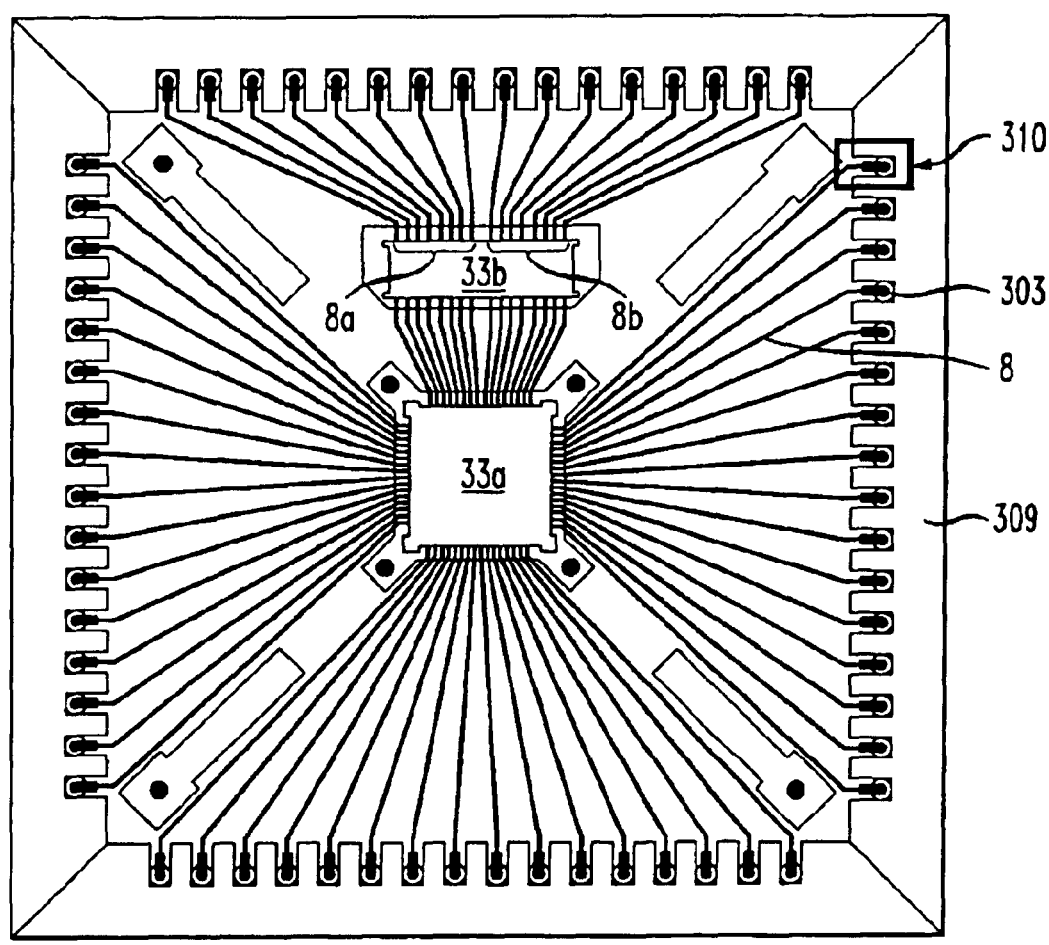
FIGS. 2b and 2c are plan views of substrates having multiple pockets.
Figure 2C:
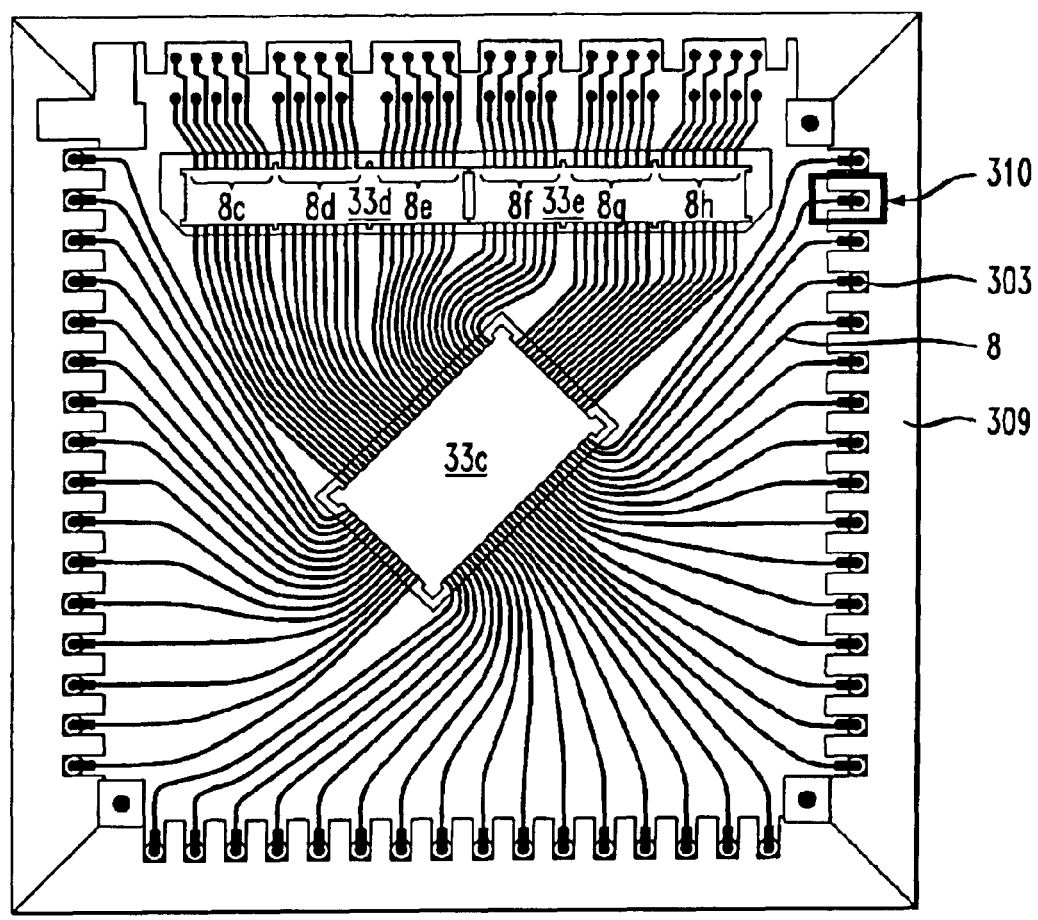

FIG. 2a is a plan view of substrate 3, showing the microstrip transmission lines 8 and pockets 33, 330 opened in the dielectric layers. The center opening 33 is provided for receiving the MMIC 6. Other openings 330 are provided to relieve the stress that can build up in the superstrate 2. Although only one MMIC pocket 33 is shown in FIG. 2a the inventors contemplate that as many pockets as desired may be used to accommodate the MMICs. For example, FIG. 2b shows a substrate 3' having two pockets 33a and 33b that receive a total of three dies. One of the pockets 33b receives two dies, and has two corresponding sets of lines 8a and 8b. FIG. 2C shows another exemplary substrate 3" having three pockets 33c, 33d and 33e. The center pocket 33c accomodates a single die (not shown). The two pockets 33d and 33e each accommodate three dies, with three corresponding sets of leads 8c–8e and 8f–8h on each pocket. The pocket 33c is rotated about 45 degrees, so that the lines 8f–8h can be routed to two different sides of the IC from the same pocket 33e. The size of the exemplary package is 35 millimeter by 35 millimeter, but other package sizes can readily be accommodated.

As best seen in FIG. 2a each signal line 8 includes a first contact 302 which is connected to a terminal of the MMIC 6 (e.g., by wire bonding) and a second contact 303 at the periphery of the substrate 3. Each second contact 303 has a respective BGA transition 310, including a plurality of ground plane portions. Each side of the substrate 3 has a ground plane structure 309. The ground plane structure 309 connects the ground plane portions 28 (each transition has a ground section 28 on the substrate as described above. When all the transitions are placed next to each other, these grounds are combined and become ground plane structure 309) of each BGA transition 310. The transition is described in more detail below with reference to FIGS. 4–8.

Figure 3:
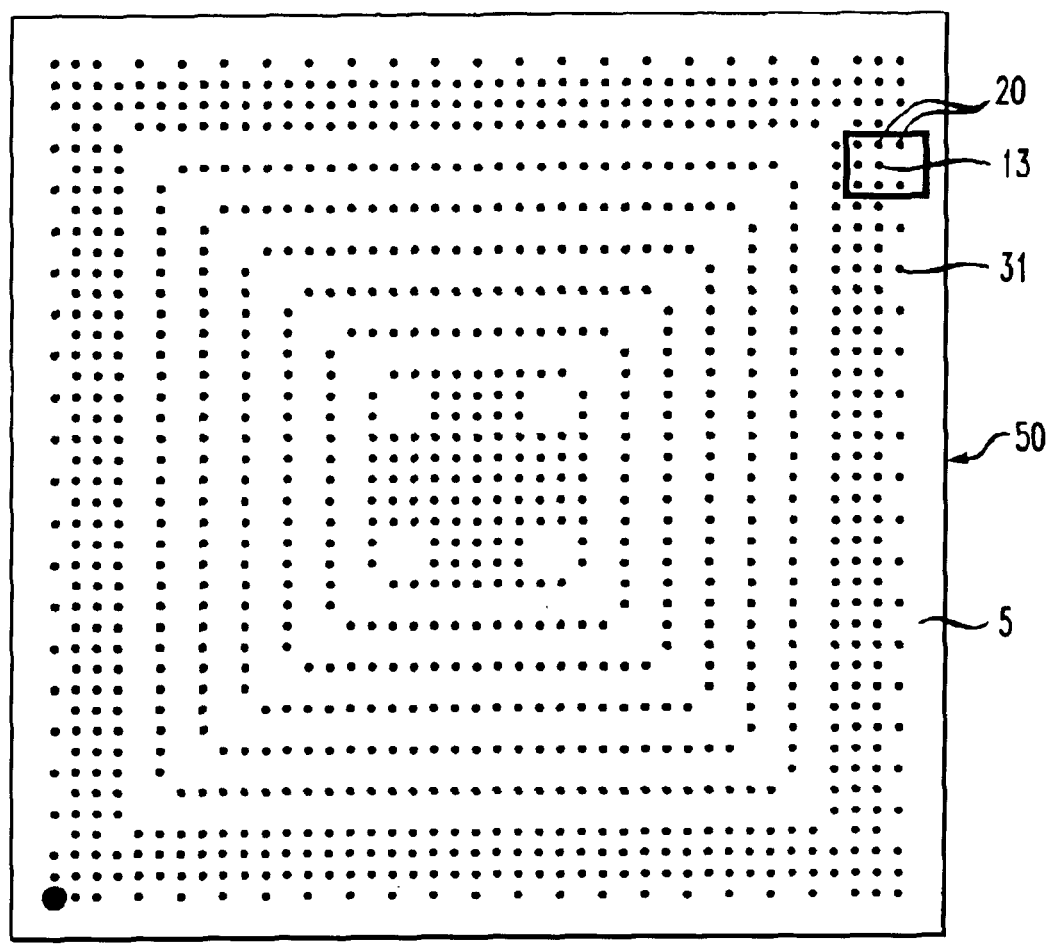
FIG. 3 is a bottom plan view of the BGA package shown in FIG. 1.

FIG. 3 shows the BGA pads 31 on the bottom of the package. Also shown is an arrangement of a signal solder ball 13 and ground solder balls 20. Note that all of the BGA connections on the periphery of the package are used for RF connections. This enables easy and straight routing of signal traces on the host PCB 21, which is important for high-frequency connections. However, the BGA connections on the interior of the package can be used for low frequency or DC connections if desired. In this particular example, the interior connections are used for grounding.

Figure 4:
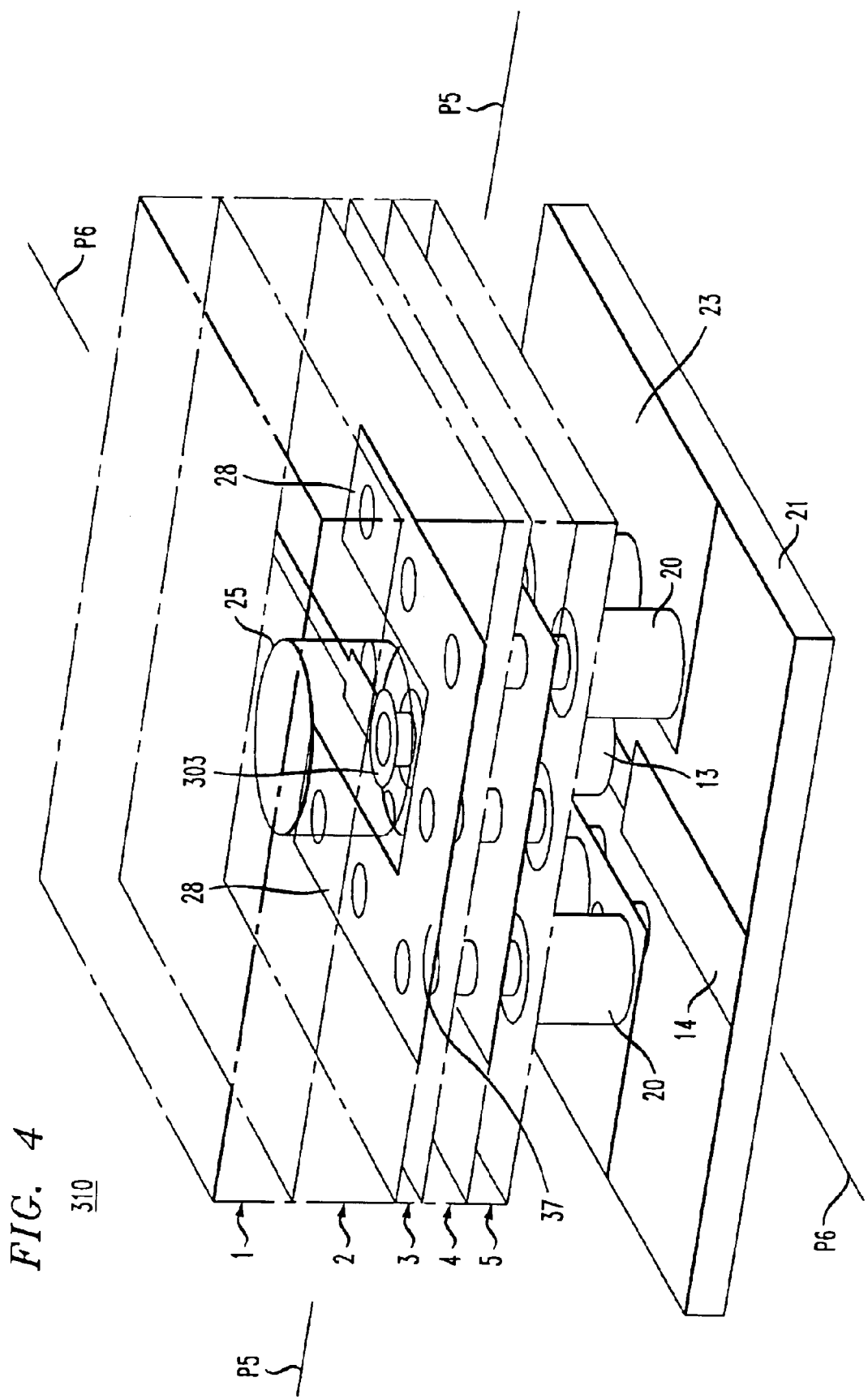
FIG. 4 is an isometric view of one of the BGA transitions shown in FIG. 2.
Figure 5:
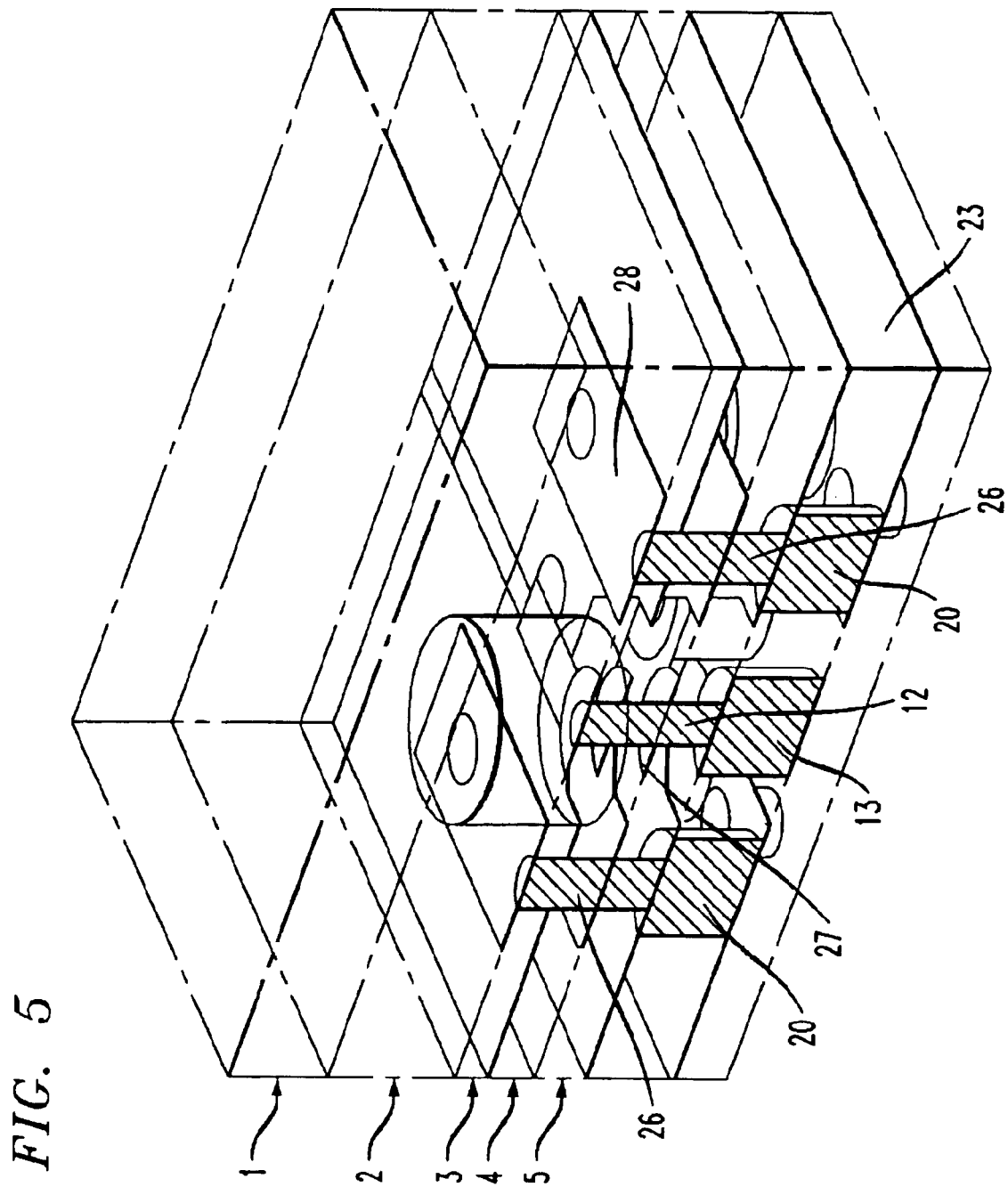
FIG. 5 is a partial cross sectional view showing the BGA transition of FIG. 4, sliced through a vertical plane passing through line P5—P5 of FIG. 4.
Figure 6:
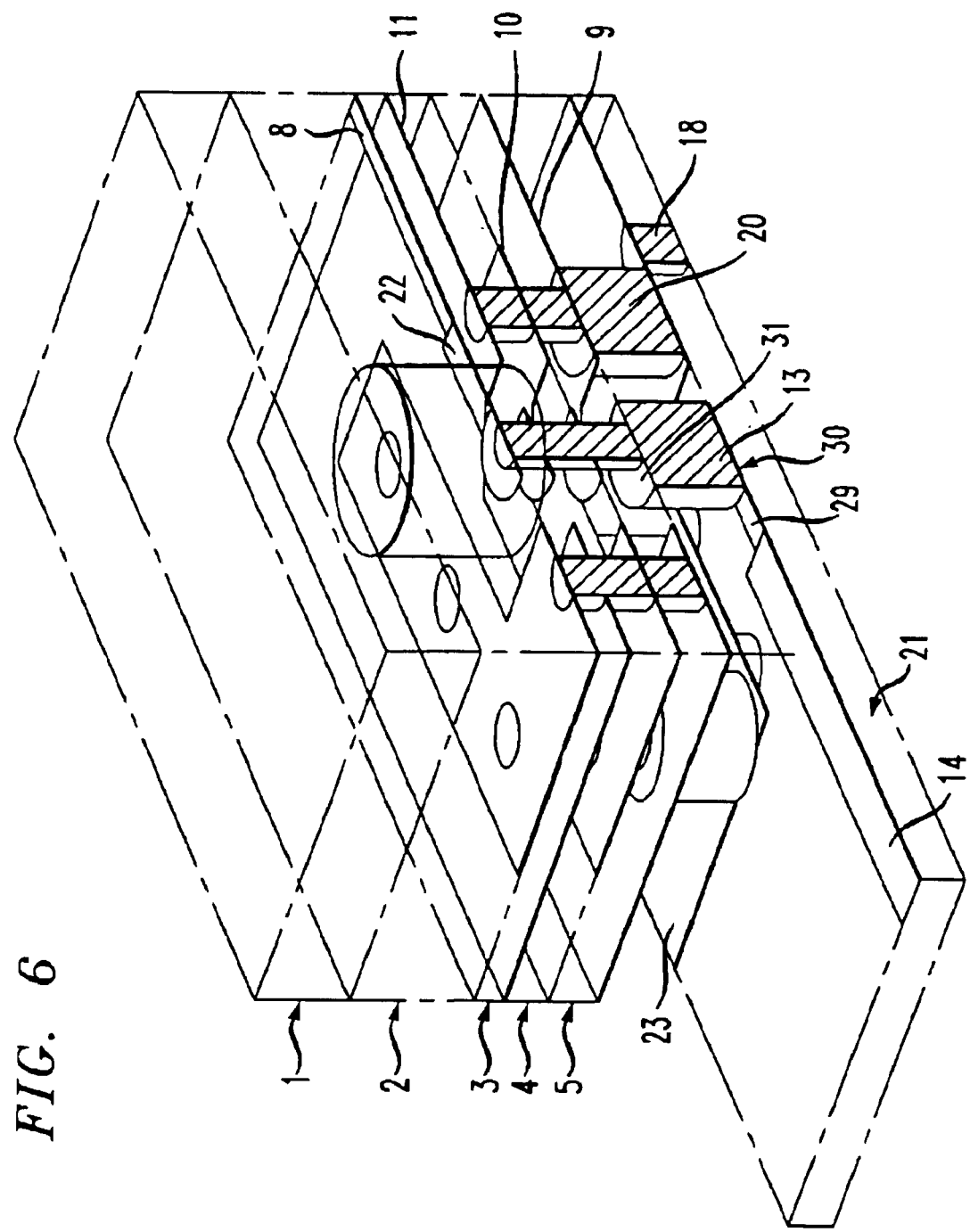
FIG. 6 is a partial cross sectional view showing the BGA transition of FIG. 4, sliced through a vertical plane passing through line P6—P6 of FIG. 4.
Figure 7:
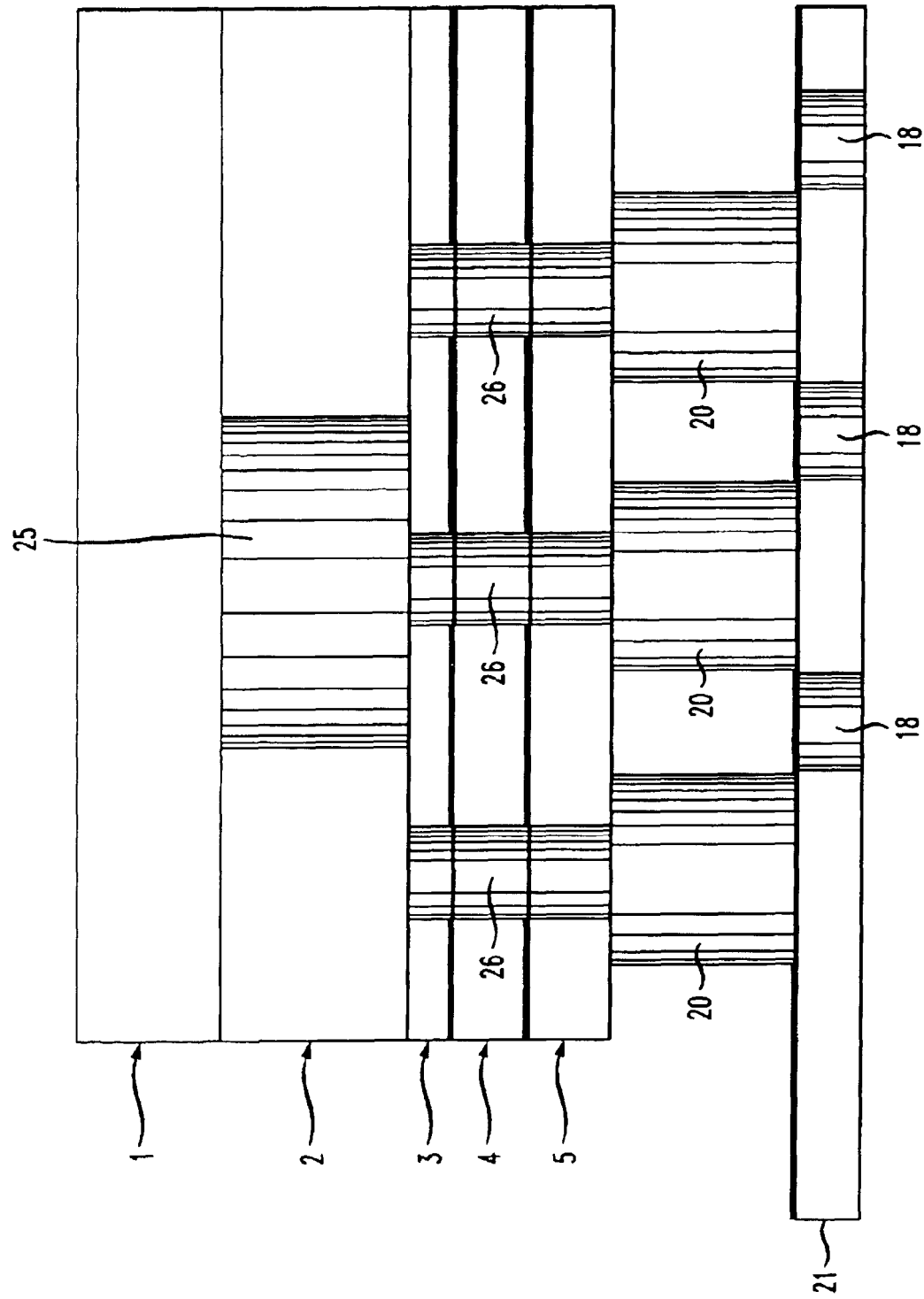
FIG. 7 is a side elevation view of the BGA transition of FIG. 4.
Figure 8:
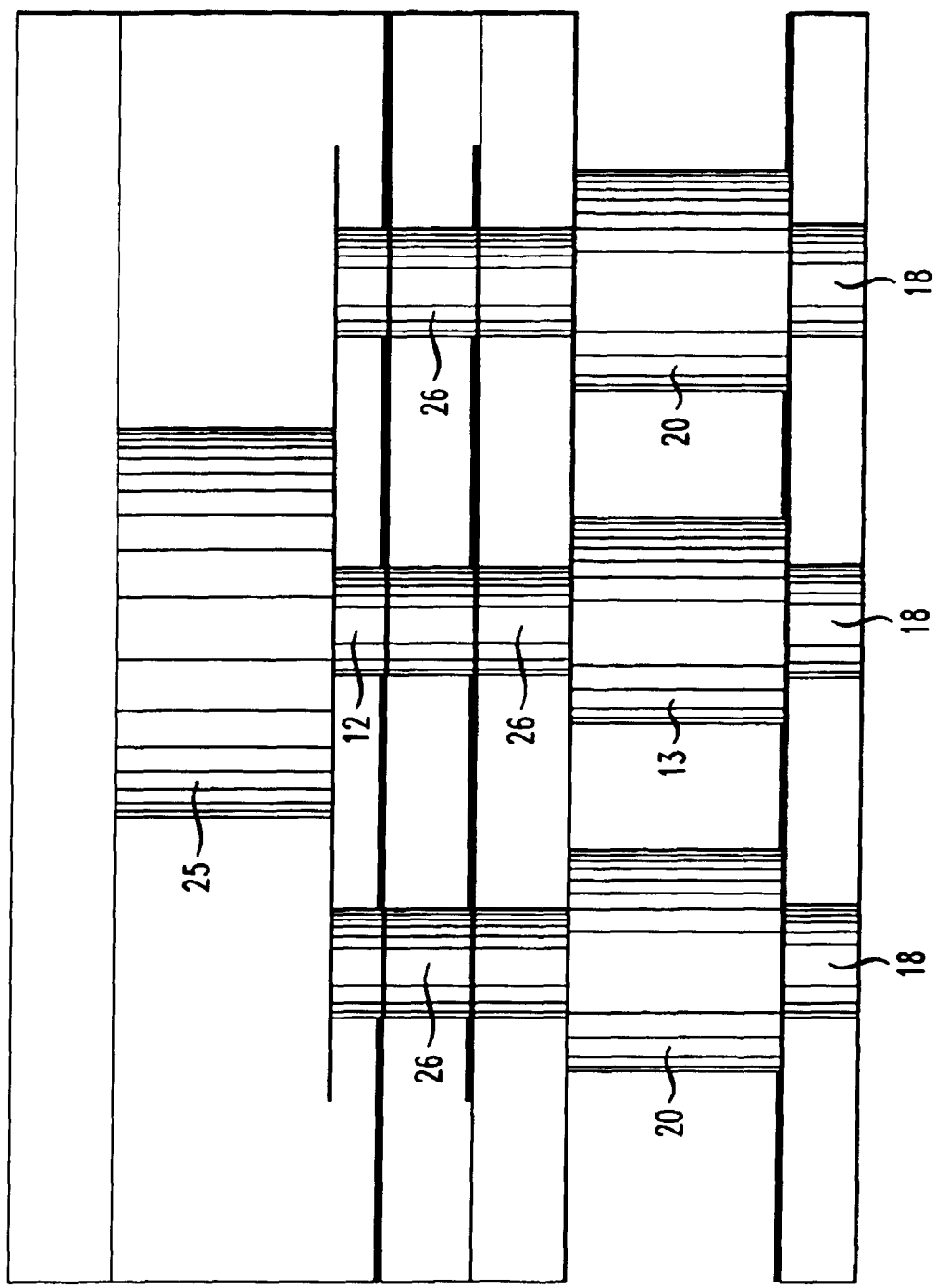
FIG. 8 is a front elevation view of the BGA transition of FIG. 4.

The structure of a single BGA transition 310 is shown in detail in FIGS. 4, 5, 6, 7, and 8. FIG. 4 is an isometric view showing a single BGA transition 310. The BGA transition 310 has the following features. A narrow transmission line section 27 is provided for matching on the host PCB 21, and connected to the pad for attachment of signal solder ball 13 to the host PCB 30. (Note that in FIGS. 4–8, solder balls 13 and 20 are depicted as cylindrical. One of ordinary skill recognizes that the shape of solder 13, 20 may vary. A signal via hole 12 (best seen in FIG. 5) is provided, to establish the electrical connection to the via pads 27, which is used for via processing. A pad 31 (best seen in FIG. 6) is provided on the bottom layer 5, for attachment of solder ball 13 on the package 50 (Circular pads 30 and 31 are hidden by the solder balls in the other drawings). A wide transmission line section 22 (best seen in FIG. 4) is provided on the substrate 3, and is used for matching. Ground vias 26 (best seen in FIG. 5) are provided in the package 50, and are used for matching.

Two rectangular ground plane portions 28 are provided on the top of the substrate 3. The two ground plane portions 28 are connected by a third ground plane portion 37. The third ground plane portions 37 of each second contact 303 (see FIG. 2a) on at least a side of the substrate 3 are continuously connected in the ground structure 309. Each of the ground plane portions 28, 37 has a plurality of ground via holes therethrough. Also, as shown in FIG. 2a each pair of adjacent ones of the second contacts have a single rectangular ground plane portion therebetween. Thus, the right ground plane portion 28 (see FIG. 4) of a first BGA transition 310 acts as the left ground plane portion of an adjacent second BGA transition to the right of the first BGA transition. As explained above, the design of BGA transition 310 is optimized mainly by changing the openings 9a–11a in ground planes 9, 10, and 11 (shown in FIG. 9) around the signal via 12. By design, the BGA solder balls 20, 13, are placed directly beneath the via holes 26, 12, to achieve the lowest inductance in the electrical transitions.

To enable a robust connection, these via-holes 12, 26 are filled with an appropriate sealing material. Otherwise, solder of the BGA balls 13, 20 would leak to the via holes 12, 26 during re-flow causing variable and open-circuit interconnect problems. The vias 12, 26 of the package can be filled with any suitable conductive material such as silver pastes and inks suitable for plating. After drying and leveling, the board surface is plated to allow a smooth surface for BGA ball mounting.

One of ordinary skill can readily determine the exact dimensions of a BGA transition 310 suitable for DC-40 GHz operation. The dimensions may be obtained by using full-wave electromagnetic (EM) simulation computer software. Since the full-wave EM software can predict the entire electromagnetic phenomenon in the system accurately, this method yields optimum design of high-frequency passive circuits.

Figure 12:
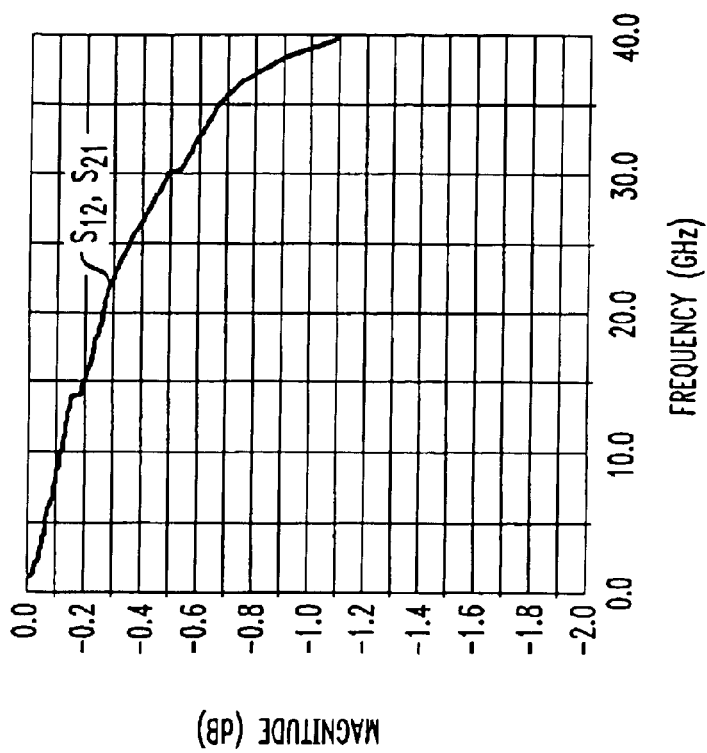
FIG. 12 is a diagram showing insertion loss for the BGA transition.
Figure 11:
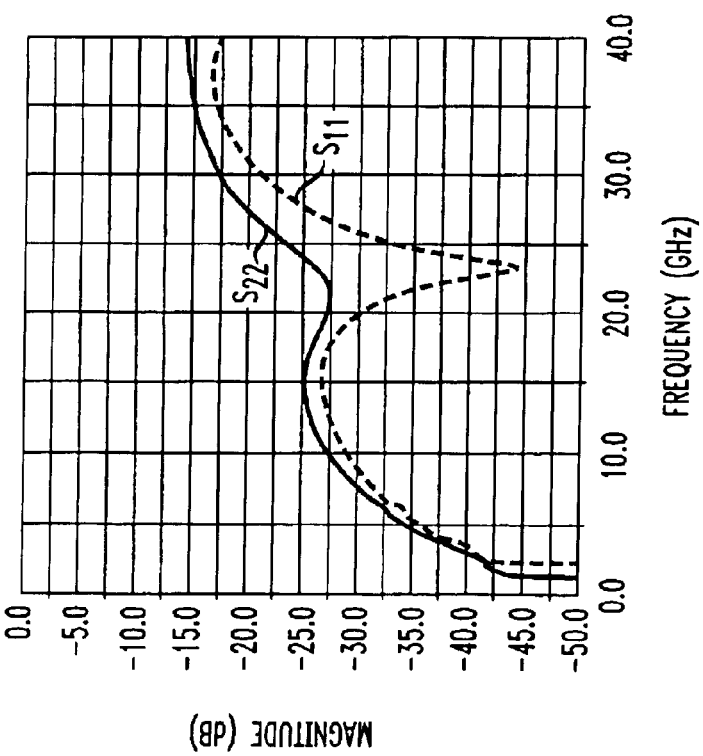
FIG. 11 is a diagram showing the return loss of the BGA transition with either the transmission line on the host PCB or the transmission line on the substrate is excited.

FIGS. 11 and 12 are diagrams showing the simulated electrical performance of an exemplary embodiment of a BGA transition 310 as described above. In FIG. 11, $S_{11}$ is the return loss when the transmission line 14 of host PCB 21 is excited, and $S_{22}$ is the return loss when the transmission line 8 of substrate 3 is excited. The loss values $S_{11}$ and $S_{22}$ can be different from each other when loss is present in the system. FIG. 12 shows the insertion loss of the transition. $S_{12}$ and $S_{21}$ are the transmission coefficients (insertion loss). For a reciprocal network they are equal each other, and are represented by the same curve in FIG. 12.

Figure 10:
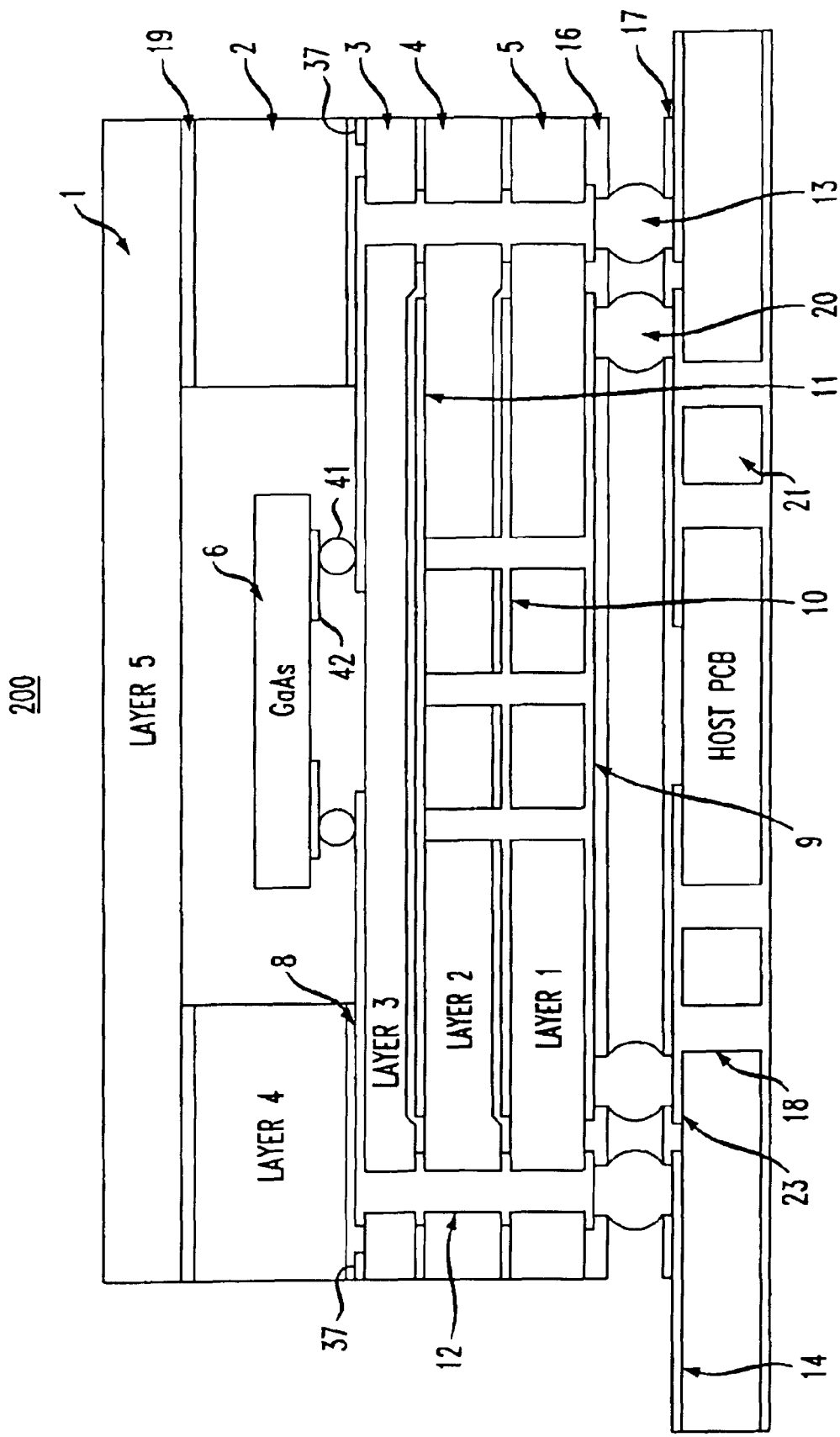
FIG. 10 is a cross sectional view of a printed circuit board assembly in which the BGA package includes a flip-chip mounted integrated circuit.

FIG. 10 is a cross sectional view of a PCB assembly 200 having a BGA package 150, in which the MMIC 46 is flip-chip mounted on the substrate 3. Although FIG. 9 only shows terminals 42 and solder balls 41 on the periphery of the MMIC 46, one of ordinary skill recognizes that terminals 42 may be distributed throughout the face of the MMIC. Preferably, any terminals 42 carrying RF signals are located on the periphery of the MMIC 46, and only DC signals (e.g., ground) are located at the center of the MMIC 46. Although not shown in FIG. 10, a conventional underfill material may be introduced between the MMIC 46 and the substrate 3.

Although the exemplary area array packages are ball grid array packages 50, the shape of the solder beneath the array is not limited to solder balls 13, 20. Thus, it is contemplated that other the invention may be practiced using column grid arrays and the like.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A substrate for an area array package,
    said substrate having a plurality of signal wirings, each having a first contact adapted to be connected to a respective terminal of an integrated circuit, and a second contact on a periphery of the substrate,
    said substrate having a ground structure including, for each signal wiring, a pair of rectangular ground plane portions located on opposite sides of the second contact of that signal wiring, and
    said substrate having a plurality of ground via holes through the substrate, including at least one respective ground via hole through each rectangular ground plane portion,
    wherein each ground plane portion has a plurality of ground via holes therethrough.

2. A substrate for an area array package,
    said substrate having a plurality of signal wirings, each having a first contact adapted to be connected to a respective terminal of an integrated circuit, and a second contact on a periphery of the substrate,
    said substrate having a ground structure including, for each signal wiring, a pair of rectangular ground plane portions located on opposite sides of the second contact of that signal wiring, and
    said substrate having a plurality of ground via holes through the substrate, including at least one respective ground via hole through each rectangular ground plane portion,
    wherein for each second contact, the respective ground plane portions are connected by a third ground plane portion on a third side of the second contact.

3. The substrate according to claim 2, wherein the third ground plane portion has a plurality of ground via holes therethrough.

4. The substrate according to claim 2, wherein the third ground plane portions of each second contact on at least a side of the substrate are continuously connected.

5. A substrate for an area array package,
    said substrate having a plurality of signal wirings, each having a first contact adapted to be connected to a respective terminal of an integrated circuit, and a second contact on a periphery of the substrate,
    said substrate having a ground structure including, for each signal wiring, a pair of rectangular ground plane portions located on opposite sides of the second contact or that signal wiring, and
    said substrate having a plurality of ground via holes through the substrate, including at least one respective ground via hole through each rectangular ground plane portion,
    wherein each pair of adjacent ones of the second contacts have a single rectangular ground plane portion therebetween.

6. A substrate for an area array package,
    said substrate having a plurality of signal wirings, each having a first contact adapted to be connected to a respective terminal of an integrated circuit, and a second contact on a periphery of the substrate,
    said substrate having a ground structure including, for each signal wiring, a pair of rectangular ground plane portions located on opposite sides of the second contact of that signal wiring, and
    said substrate having a plurality of ground via holes through the substrate, including at least one respective ground via hole through each rectangular ground plane portion,
    wherein the substrate has an opening therethrough sized and shaped to receive the integrated circuit.

7. An area array package comprising:
    a substrate having:
        a plurality of signal wirings, each having a first contact adapted to be connected to a respective terminal of an integrated circuit, and a second contact on a periphery of the substrate,
        a ground structure including, for each signal wiring, a pair of rectangular ground plane portions located on opposite sides of the second contact of that signal wiring, and
        a plurality of ground vias through the substrate, including at least one respective ground via hole through each rectangular ground plane portion;
    a cover above the substrate,
    a bottom layer of the package formed of a dielectric material; and
    an intermediate dielectric layer between the bottom layer and the substrate, the intermediate dielectric layer having an additional ground structure thereon.

8. The package of claim 7, further comprising a third ground structure between the bottom layer and the intermediate layer.

9. The package of claim 7, wherein the additional ground structure has a ground opening around a signal via that is coupled to the second contact, the ground opening being generally shaped like a rectangle with two mitered corners.

10. An area array package comprising:
    a substrate having:
        a plurality of signal wirings, each having a first contact adapted to be connected to a respective terminal of an integrated circuit, and a second contact on a periphery of the substrate,
        a ground structure including, for each signal wiring, a pair of rectangular ground plane portions located on opposite sides of the second contact of that signal wiring, and
        a plurality of ground vias through the substrate, including at least one respective ground via hole through each rectangular ground plane portion;
    a cover above the substrate, and
    a bottom layer of the package formed of a dielectric material,
    wherein the package has a signal via beneath each second contact, and a ground via beneath each ground via hole, each of the signal vias and ground vias being electrically connected to a respective solder attach pad on the bottom layer.

11. The package of claim 10, wherein each signal via is surrounded on three sides.

12. The package of claim 11, wherein each signal via is surrounded by at least seven ground vias.

13. An area array package comprising:
a substrate having:
- a plurality of signal wirings, each having a first contact adapted to be connected to a respective terminal of an integrated circuit, and a second contact on a periphery of the substrate,
- a ground structure including, for each signal wiring, a pair of rectangular ground plane portions located on opposite sides of the second contact of that signal wiring, and
- a plurality of ground vias through the substrate, including at least one respective ground via hole through each rectangular ground plane portion;

a cover above the substrate,
a bottom layer of the package formed of a dielectric material; and
a superstrate above the substrate, the superstrate generally being formed of the same material as the substrate.

14. The package of claim 13, wherein the superstrate has an opening therethrough above each second contact.

15. The package of claim 14, wherein the opening above each second contact is cylindrical and is greater in diameter than the ground vias.

16. The package of claim 14, wherein the opening above each second contact is filled with a material having a sufficiently low dielectric constant to reduce the radiation from a region of the second contact significantly.

17. An area array package comprising:
a substrate having:
- a plurality of signal wirings, each having a first contact adapted to be connected to a respective terminal of an integrated circuit, and a second contact on a periphery of the substrate,
- a ground structure including, for each signal wiring, a pair of rectangular ground plane portions located on opposite sides of the second contact of that signal wiring, and
- a plurality of ground vias through the substrate, including at least one respective ground via hole through each rectangular ground plane portion;

a cover above the substrate, and
a bottom layer of the package formed of a dielectric material,
wherein the package includes a plurality of pockets, each pocket shaped and sized to accommodate an integrated circuit.

18. A printed circuit board assembly, comprising:
a printed circuit board having a circuit board substrate with circuit traces and a plurality of devices thereon, said plurality of devices including at least one integrated circuit package assembly that includes:
a package substrate having:
- a plurality of signal wirings, each having a first contact adapted to be connected to a respective terminal of an integrated circuit, and a second contact on a periphery of the package substrate,
- a ground structure including, for each signal wiring, a pair of rectangular ground plane portions located on opposite sides of the second contact of that signal wiring, each ground plane portion having a plurality of ground via holes therethrough, and
- a plurality of ground vias through the package substrate, including the plurality of ground via holes through each rectangular ground plane portion;

a lid above the package substrate, and
a bottom layer of the package formed of a dielectric material, the bottom layer having a plurality of solder attach pads, electrically connected to contacts of the circuit board substrate.

19. The assembly of claim 18, wherein for each second contact, the respective ground plane portions are connected by a third ground plane portion on a third side of the second contact.

20. The assembly of claim 19, wherein the third ground plane portion has a plurality of ground via holes therethrough.

21. The assembly of claim 19, wherein the third ground plane portions of each second contact on at least a side of the substrate are continuously connected.

22. The assembly of claim 18, wherein each pair of adjacent ones of the second contacts have a single rectangular ground plane portion therebetween.

23. The assembly of claim 18, wherein the package substrate has an opening therethrough sized and shaped to receive the integrated circuit.

* * * * *